United States Patent
Rayssac et al.

(10) Patent No.: US 7,391,094 B2
(45) Date of Patent: Jun. 24, 2008

(54) SEMICONDUCTOR STRUCTURE AND METHOD OF MAKING SAME

(75) Inventors: Olivier Rayssac, Grenoble (FR); Muriel Martinez, St. Egreve (FR); Sephorah Bisson, Grenoble (FR); Lionel Portigliatti, Seyssin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 162 days.

(21) Appl. No.: 11/299,895

(22) Filed: Dec. 13, 2005

(65) Prior Publication Data

US 2006/0086949 A1 Apr. 27, 2006

Related U.S. Application Data

(62) Division of application No. 10/777,721, filed on Feb. 11, 2004, now Pat. No. 6,989,314.

(60) Provisional application No. 60/495,259, filed on Aug. 13, 2003.

(30) Foreign Application Priority Data

Feb. 12, 2003 (FR) .................................. 03 01657

(51) Int. Cl.
*H01L 23/58* (2006.01)

(52) U.S. Cl. ..................... 257/496; 257/635; 257/637; 257/638

(58) Field of Classification Search ................. 257/620, 257/635, 637–640, 649, 496; 438/406, 455, 438/458, 462
See application file for complete search history.

(56) References Cited

U.S. PATENT DOCUMENTS

| 5,782,975 | A | 7/1998 | Linn ........................... 438/288 |
|---|---|---|---|
| 5,855,693 | A | 1/1999 | Murari et al. ................ 438/455 |
| 6,146,979 | A | 11/2000 | Henley et al. ................ 438/458 |
| 2001/0000733 | A1 | 5/2001 | Tomioka ......................... 427/8 |
| 2002/0069816 | A1 | 6/2002 | Gehrke et al. .................. 117/84 |
| 2002/0089016 | A1 | 7/2002 | Joly et al. ..................... 257/349 |
| 2002/0192959 | A1 | 12/2002 | Shibata et al. ............... 438/689 |

FOREIGN PATENT DOCUMENTS

DE 199 36 905 A1 3/2001
JP 58-178519 10/1983

OTHER PUBLICATIONS

Lide, David R., "CRC Handbook of Chemistry and Physics," CRC Press, pp. 174175, 177-178 (1996).

*Primary Examiner*—Hung Vu
(74) *Attorney, Agent, or Firm*—Winston & Strawn LLP

(57) ABSTRACT

A semiconductor structure includes a substrate having a surface and being made of a material that provides atypical surface properties to the surface, a bonding layer on the surface of the substrate, and a further layer molecularly bonded to the bonding layer. A method for fabricating such a semiconductor structure includes providing a substrate having a surface and being made of a material that provides atypical surface properties to the surface, providing a bonding layer on the surface of the substrate, smoothing the bonding layer to provide a surface that is capable of molecular bonding, and molecularly bonding a further layer to the bonding layer to form the structure. The atypical surface properties preferably include at least one of a roughness of more than 0.5 nm rms, or a roughness of at least 0.4 nm rms that is difficult to polish, or a chemical composition that is incompatible with molecular bonding.

13 Claims, 3 Drawing Sheets

SEMICONDUCTOR STRUCTURE AND METHOD OF MAKING SAME

CROSS-REFERENCE TO RELATED APPLICATIONS

This application is a divisional of application Ser. No. 10/777,721 filed Feb. 11, 2004 now U.S. Pat. No. 6,989,314, which claims the benefit of provisional application No. 60/495,259 filed Aug. 13, 2003. The content of each application is expressly incorporated herein by reference thereto.

BACKGROUND ART

The invention generally relates to the field of substrates or structures for producing electronic components, and to methods of producing such structures. It is applicable to semiconductor structures, in particular silicon on insulator (SOI) type structures. The invention also pertains to techniques for assembling layers or substrates on a substrate of a material having atypical surface properties.

FIG. 1 illustrates a conventional structure that includes a silicon layer 4 in which the components are located, and beneath which is a buried oxide layer 2. A silicon substrate 6 acts as a mechanical support. The oxide layer 2 provides insulation from stray currents and charges from ionized particles. It also provides good insulation between neighboring components formed in the same silicon layer, and in particular the oxide layer substantially reduces stray capacitance between the neighboring components.

The superficial silicon layer 4 is typically about 10 nanometers (nm) to 1000 nm thick, while the oxide layer 2 is on the order of several hundred nanometers thick, for example 400 nm. This type of structure can be obtained by using a "SIMOX" type process or by using a "wafer bonding" technique that relies on molecular bonding.

After producing an assembly such as that shown in FIG. 1, electronic components can be fabricated in the superficial silicon layer 4. The silicon layer 4 is therefore an active layer; the oxide layer 2 is an insulation layer; and the substrate 6 acts as a mechanical support that allows for processing of the assembly.

Proper operation of a component fabricated in the layer 4 depends upon various parameters. One of the parameters is heating, which can substantially limit the performance of the component. Thus, it would be advantageous to have a semiconductor on insulator type structure, and a method of producing such a structure, in which heating does not limit the performance of the subsequently produced components, or minimally limits the performance in comparison to known structures.

Furthermore, known techniques for assembling materials do not allow bonding of substrates or layers having an atypical surface that has a roughness of more than a certain limiting value on the order of 0.5 nm root mean square (rms), or which are difficult to polish, or which have a chemical composition that is not conducive to molecular bonding. Occasionally a need arises to bond materials that have a roughness above the limiting value, or wherein at least one of the materials is difficult to polish or has a chemical composition that is not conducive to bonding by molecular bonding, or to bond such a material with a layer or substrate of a material that may itself be compatible with direct bonding or molecular bonding.

SUMMARY OF THE INVENTION

Presented is a semiconductor structure that includes a substrate having a surface and being made of a material that provides atypical surface properties to the surface, a bonding layer on the surface of the substrate, and a further layer molecularly bonded to the bonding layer. The atypical surface properties preferably is at least one of a roughness of more than 0.5 nm rms, or a roughness of at least 0.4 nm rms that is difficult to polish, or a chemical composition that is incompatible with molecular bonding.

In an advantageous implementation, the substrate has a thermal conductivity of more than 1 W/cm/K, and may be made of diamond or aluminum nitride material. An intermediate layer to provide the surface layer having the atypical properties layer may be provided before forming the bonding layer. The intermediate layer preferably has a thermal conductivity coefficient that is higher than that of the substrate or that is between that of the bonding layer and that of the substrate. The intermediate layer may be made of silicon nitride.

In another advantageous variation of the invention, the further layer is a semiconductor material of at least one of silicon, germanium, gallium arsenide, silicon-germanium, a semiconductor Group III-Group V material, or a semiconductor Group II-Group VI material. The structure may form a Semiconductor-On-Insulator (SOI) structure. At least one portion of a surface of the bonding layer facing the further layer is a distance of 10 nm or less from the surface of a peak of the substrate to optimize heat transfer from the further layer to the substrate. The structure may also include at least one power component, or radio frequency (RF) component, or insulated gate bipolar transistor (IGBT) component, or metal oxide on silicon field effect transistor (MOSFET) component in the further layer of semiconductor material.

In yet another implementation, the further layer is a second substrate of a material having atypical surface properties. The atypical surface properties of the second substrate may include at least one of a roughness of more than 0.5 nm rms, or a roughness of at least 0.4 nm rms that is difficult to polish, or a chemical composition that is incompatible with molecular bonding.

A further aspect of the invention pertains to a method for fabricating such a semiconductor structure. The technique includes providing a substrate having a surface and being made of a material that provides atypical surface properties to the surface, providing a bonding layer on the surface of the substrate, smoothing the bonding layer to provide a surface that is capable of molecular bonding, and molecularly bonding a further layer to the bonding layer to form the structure. Again, the atypical surface properties preferably comprise at least one of a roughness of more than 0.5 nm rms, or a roughness of at least 0.4 nm rms that is difficult to polish, or a chemical composition that is incompatible with molecular bonding.

In an advantageous implementation, the method includes forming an intermediate layer on the substrate to provide the surface layer having the atypical properties before providing the bonding layer, the intermediate layer having a thermal conductivity coefficient that is higher than that of the substrate or that is between that of the bonding layer and that of the substrate. The intermediate layer may be composed of silicon nitride.

In an implementation, the further layer is made of a semiconductor material and at least one of a power component and a radio frequency (RF) component are fabricated in the further layer.

In another advantageous embodiment, the further layer is a second substrate of a material having atypical surface properties. The method may further include providing a second bonding layer on the second substrate before molecularly bonding, and the second substrate may be made of at least one of diamond or aluminum nitride.

BRIEF DESCRIPTION OF THE DRAWINGS

Other aspects and advantages of the present invention will become clear from reading the following detailed description of the preferred embodiments of the invention, given by way of example and with reference to the appended drawings, in which.

DETAILED DESCRIPTION OF THE PREFERRED EMBODIMENTS

The present invention permits a semiconductor material layer and a bonding layer to be bonded by molecular bonding even if the substrate or intermediate layer has a roughness value that is above the accepted limiting roughness for molecular bonding (which is about 0.5 nm rms), or if the substrate or intermediate layer is difficult to polish, or has a chemical composition that is incompatible with bonding by molecular bonding. It is therefore possible to use a substrate, or a base layer formed on the substrate, from a material, for example, such as diamond or aluminum nitride (AlN). Such materials are chemically inert, very difficult to polish and, even after mechanical and chemical treatment, have a roughness value that is much higher than the accepted limit for bonding by molecular bonding. Components can thus be advantageously produced in the semiconductor layer, in particular power components, high-power components, or radio frequency (RF) type components, since the heat released by such components can be evacuated by the substrate, which acts as a heat sink.

Figure 1:
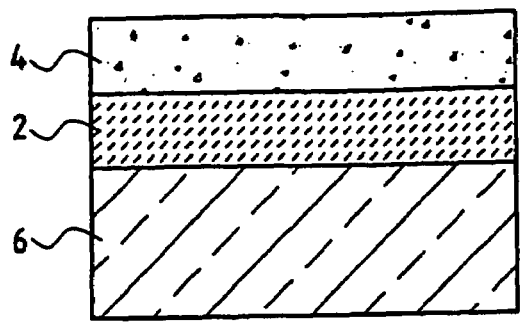
FIG. 1 shows a known Semiconductor-On-Insulator (SOI) structure.
Figure 2:
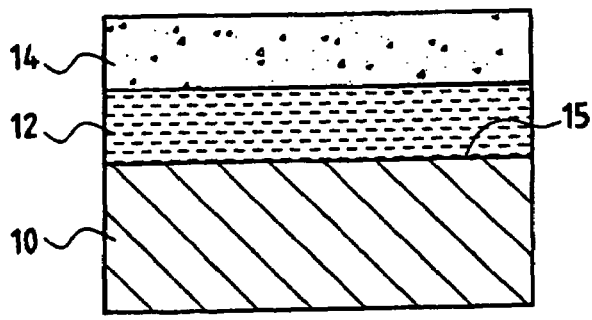
FIGS. 2, 3, 4A and 4B show various structures according to the present invention.

FIG. 2 shows a first example of a structure in accordance with the invention. FIG. 2 depicts a substrate 10 having atypical surface properties. The term "atypical surface properties" means surface properties of an untreated surface that would prevent or interfere with molecular bonding of that surface to another component. The substrate 10 is preferably formed from an electrically insulating material. The substrate 10 includes a layer 14 formed from a semiconductor material such as silicon or germanium (Ge) or gallium arsenide (GaAs) or silicon-germanium (SiGe) or Group III-Group V semiconductor components or Group II-Group VI semiconductor components, and a bonding layer 12 located between the substrate 10 and the layer 14. The layer 14 may be another substrate in another embodiment. The substrate 10 may also be a substrate having a rough surface 15, and can, for example, be in the range of about 100 micrometers (μm) to about 2 millimeters (mm) thick.

The surface 15 having atypical surface properties may have a roughness of more than 0.4 nm rms or 0.5 nm rms. For practical reasons, molecular bonding cannot be carried out, or is very difficult to carry out, on a substrate or a layer having such a rough surface (see in particular Q. Y. Tong and U. Gösele, Semiconductor Molecular bonding: Science and Technology, Wiley-Interscience, p 86, 1999). The atypical surface properties of the substrate can also be a chemical composition that does not accept molecular bonding or that provides chemical properties that are incompatible with molecular bonding. The substrate 10 can also be formed from a material that is difficult to polish, i.e., wherein a surface roughness of less than 0.4 nm rms or 0.5 nm rms can only be obtained after polishing for a very long period. These are additional examples of atypical surface properties. In practice, such a material cannot be used because it would be too expensive to treat or polish it to obtain a suitable bonding surface roughness of less than 0.4 nm rms or 0.5 nm rms.

The mechanical strength of the molecular bond of an assembly that includes, for example, such a substrate and a layer or substrate formed from a semiconductor material can be measured by means of a bonding wave. For example, the bonding wave could be transmitted by infrared transmission through silicon, or by an alternate method in the case of transparent materials, or by acoustic microscopy in the presence of metallic layers. Mechanical strength can also be determined by measuring the bonding energy using a blade technique (as described by W. P. Maszara et al., Journal of Applied Physics, Vol. 64, page 4943, 1988, for example). At ambient temperature and in a hydrophilic case, if bonding is effective then the bonding energy is greater than 60 millijoules per square meter ($mJ/m^2$) or, for example, greater than 70 $mJ/m^2$ or, for example, 100 $mJ/m^2$. Thus, the strength of the molecular bond can be determined by measuring the mechanical strength.

Diamond and aluminum nitride (AlN) are examples of materials that can be used for the substrate 10. The roughness of these materials is well above the value of 0.5 nm rms; the roughness of diamond is in the range of about 30 nm rms to about 100 nm rms; and the roughness of aluminum nitride is on the order of 1 nm rms, or in the range of about 0.5 nm rms to about 10 nm rms. These materials are chemically inert, in particular when products such as "Caro" (a mixture based on sulfuric acid and hydrogen peroxide) and "SC1" (a mixture based on ammonium hydroxide, hydrogen peroxide and water) are used during processing. Preferably, the substrate 10 is formed from a material with a high thermal conductivity, for example more than 1 W/cm/K, as is the case for diamond or aluminum nitride AlN (3.2 W/cm/K).

A layer or base layer, itself on a substrate, can also be used in place of the substrate 10. The base layer can then have a thickness of several tens of nm, for example, in the range of about 50 nm to about 300 nm. The material for the base layer has the same properties as those described above in the case of a substrate, that is the base layer material has an atypical surface that is difficult to polish, or has a roughness of more than 0.4 nm rms or 0.5 nm rms, or has a surface with a chemical composition that is incompatible with or which will not accept molecular bonding, or wherein the chemical properties are incompatible with molecular bonding.

For example, diamond or aluminum nitride can be provided either in the form of the substrate or in the form of a further layer on a substrate. If in the form of a further layer, the substrate, for example, could be formed from silicon. A diamond or aluminum nitride material can be deposited on the silicon substrate by a CVD type technique. The term "substrate" herein designates these two alternatives.

The bonding layer 12 has a roughness that is less than 5 nm rms after mechanical and chemical treatment, or polishing. This enables the material of the substrate 10 to bond with the semiconductor material layer 14. The layer 14 is preferably affixed to the bonding layer 12 by molecular bonding.

In one example, the layer 12 is formed from silicon dioxide. It can also be formed from a material of the "high K coefficient" type such as those described in the MRS Bulletin, March 2002, volume 27, no. 3 "Alternative Gate Dielectrics for Microelectronics": Examples of such materials are hafnium oxide ($HfO_2$), zirconium oxide ($ZrO_2$), alumina ($Al_2O_3$), and yttrium oxide ($Y_2O_3$).

Figure 3:
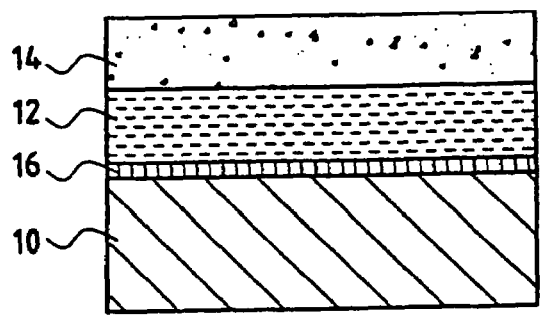

A further embodiment is shown in FIG. 3, which includes reference numbers which are identical to those of FIG. 2 when designating identical or corresponding elements. The structure shown in FIG. 3 includes a further layer 16 intermediate or between the bonding layer 12 and the substrate 10. The thermal conductivity coefficient of this intermediate layer is in the range from that of the bonding layer to that of the substrate or is higher than that of the substrate. For example, for a bonding layer formed from silicon dioxide ($SiO_2$), with a thermal conductivity coefficient of 0.01 W/cm/K, and for a diamond substrate with thermal conductivity of 20 W/cm/K, an intermediate layer of silicon nitride ($Si_3N_4$) is sufficient, as this material has a thermal conductivity coefficient of 0.3 W/cm/K. If the bonding layer 12 is formed from a high K coefficient type material, silicon nitride $Si_3N_4$ can also be used as the intermediate layer.

Preferably, the material of the further layer 16 is far more resistant or selective than that of the bonding layer 12 with regard to physico-chemical treatments, or as regards polishing such as mechanical and chemical polishing. However, it is preferable to select a material for the further layer 16 to have molecular bonding properties that are similar to those of the material of the bonding layer 12, whether for hydrophilic or hydrophobic molecular bonding.

Figure 4A:
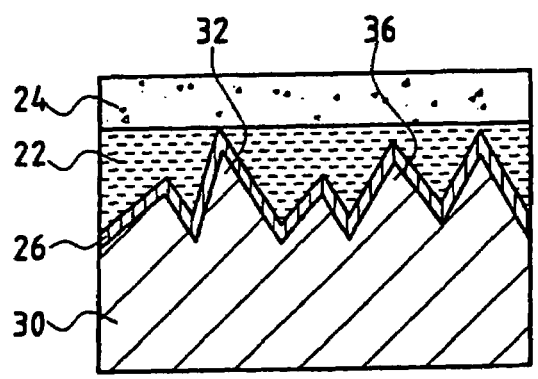

FIG. 4A shows a structure similar to that of FIG. 3, but the roughness in the upper surface of the substrate 30 has been exaggerated. The bonding layer 22 has been polished to skim the upper peaks 32, 36 of the surface of the substrate 30. These peaks create heat conduction channels which encourage heat transfer between the silicon layer 24 and the substrate 30.

Figure 4B:
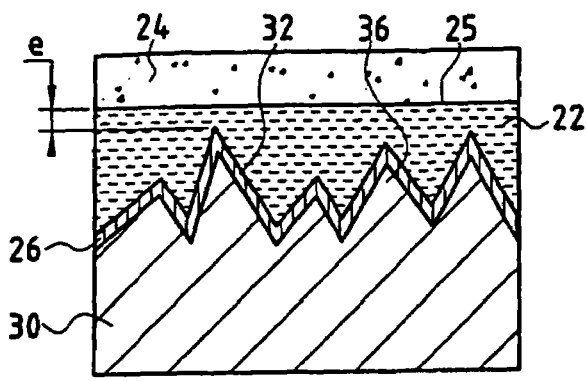

In a variation, shown in FIG. 4B, the surface 25 of the bonding layer 22 is located at a maximum of 10 nm from the maximum peaks or bumps of the substrate to optimize heat transfer by the peaks or bumps to the substrate 30. This thickness or distance from the surface 25 can be measured at any time, for example by using an ellipsometer, even while the bonding layer 22 is being prepared.

Thus, the roughness of the substrate is exploited to encourage heat transfer between the upper layers of the structure, which contain electronic components, and the base of the substrate 30. In the case of diamond, heat transfer between the upper layer of silicon and the diamond substrate is improved by a factor of about 60. This results in improved functioning of components formed in the layer 24. Such components can thus be power components, which release a large amount of heat energy. Examples of such components include insulated gate bipolar transistors (IGBTs), metal oxide on silicon field effect transistors (MOSFETs), and radio frequency (RF) components (for high speed operation).

Typically, after smoothing or polishing, the thickness of the bonding layer 12, 22 is in the range of about 5 nm to about 50 nm, for example, and the thickness of the intermediate layer 16, 26 is in the range of about 5 nm to about 20 nm.

Figure 5A:
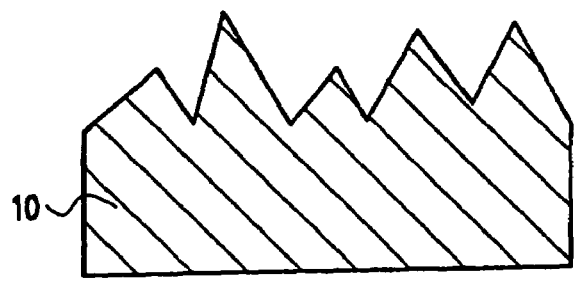
FIGS. 5A to 5D show various steps in a method of producing a structure according to the invention.
Figure 5B:
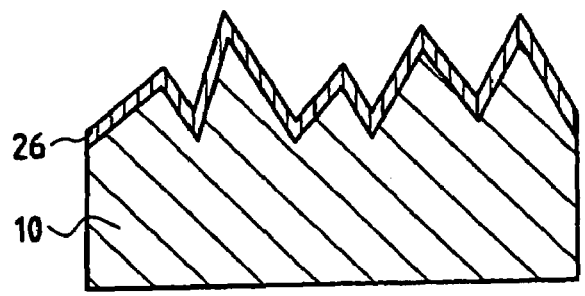
Figure 5C:
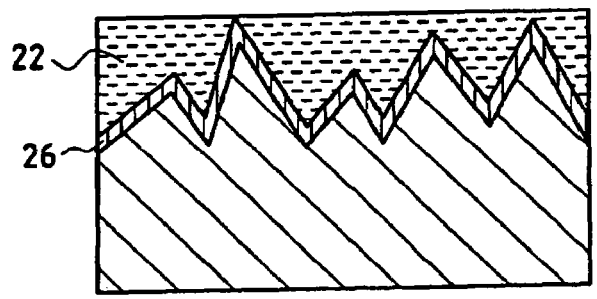
Figure 5D:
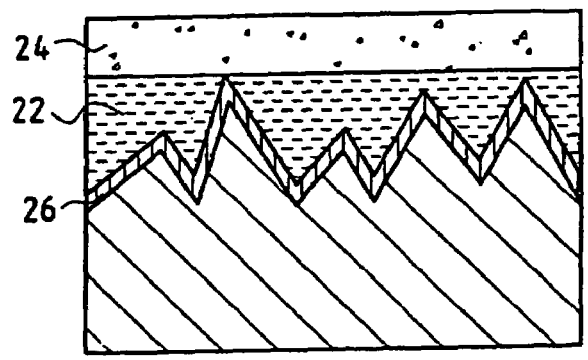

A method of producing a component according to the invention is described below with reference to FIGS. 5A to 5D. FIG. 5A shows a substrate 10 having a greatly exaggerated surface roughness. Such a substrate has not undergone polishing, or cannot be polished, and has surface roughness or micro-roughness that is greater than the accepted limit for bonding by molecular bonding. For example, the surface roughness or micro-roughness may be in the range of about 5 nm rms (or 20 or 30 nm rms) to about 100 nm rms. An intermediate layer 26, in this case composed of $SI_3N_4$, is formed on the substrate. This layer follows the roughness of the upper surface of the substrate. It may be deposited, for example, by plasma enhanced chemical vapor deposition (PECVD) or low-pressure CVD (LPCVD). A bonding layer 22 is subsequently formed, for example a layer of silicon dioxide $SiO_2$. Preferably, the initial thickness of this layer is more than 2.8 to 3 times the value of the surface roughness of the substrate 30, in order to obtain a flat layer after polishing. For example, the bonding layer 22 initially has a thickness in the range of about 0.5 micrometers (µm) to about 1 µm, or in the range of about 0.5 µm to about 10 µm. The bonding layer then undergoes polishing, for example by mechanical and chemical polishing. Certain processes such as the shallow trench isolation (STI) process (described, for example, in an article by C. P. Chang et al, "A Highly Manufacturable Corner Rounding Solution for 0.18 µm Shallow Trench Isolation", IEDM 97—page 661), have high selectivity between the nitride or further layer 26 and the oxide or buffer layer 22. The selectivity enables the layer 22 to be smoothed until a peak of the layer 26 is reached, which peak then acts as the stop point for the smoothing process.

A silicon layer or substrate 24 can then be attached or bonded to the bonding layer 22 by molecular bonding, using known techniques, for example those described in the article by Tong and Gösele cited above.

It is possible to bond a silicon substrate 24 and then to form a thin layer by thinning and polishing the substrate, or to use the SMART CUT® technique as described, for example, in the article by A. J. Auberton-Hervé et al, "Why can Smart Cut change the future of microelectronics?" published in the Journal of High-Speed Electronics and Systems, vol. 10, no. 1 (2002), pages 131-146. In yet another technique, a porous layer of silicon may be formed to obtain a plane of weakness defining a thin layer, for example as described in the article by K. Sataguchi et al., "Eltran by Splitting Porous Si Layers", Proceedings of the $9^{th}$ International Symposium on Silicon-on-Insulator Tech and Device, 99-3, The Electrochemical Society, Seattle, pages 117-121, 1999. Thus, a structure such as that shown in FIG. 5D can be obtained, which is similar to that of FIG. 4A. Components can then be produced in the layer 24, in particular power or RF components, and the substrate 10 can eliminate the heat produced by the components during their operation.

Figure 6:
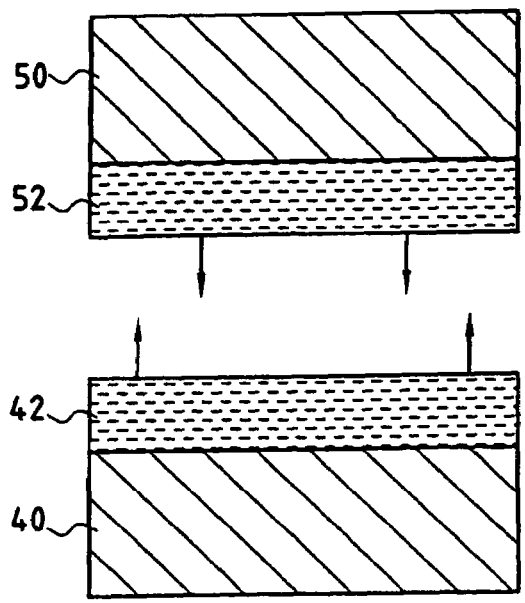
FIGS. 6 and 7 show other implementations of structures according to the invention.

A further implementation of the invention is shown in FIG. 6. In this variation, a substrate 40 (which could also be a layer) with atypical surface properties, e.g., high roughness (more than 0.4 nm rms or 0.5 nm rms, for example, in the range of about 1 nm rms to about 100 nm rms), or which is difficult to polish or has a chemical composition that is incompatible with bonding by molecular bonding, is treated so that it can be bonded to another substrate 50 (which may be a layer) with the same properties. For example, the substrate 40 is formed from diamond while the substrate 50 is formed from diamond or AlN (aluminum nitride).

Referring again to FIG. 6, a bonding layer 42, 52 is formed on each substrate as explained above, either directly or with an intermediate layer, also as described above. Each of the bonding layers is formed from silicon dioxide, for example. It is then possible to establish a bond by molecular bonding between these two bonding layers. This method is advantageous when at least one of the two materials is difficult to polish and is chemically inert, in the sense indicated above. The foregoing description also applies if the layer of silicon or semiconductor material is replaced by a rough substrate-bonding layer assembly.

Figure 7:
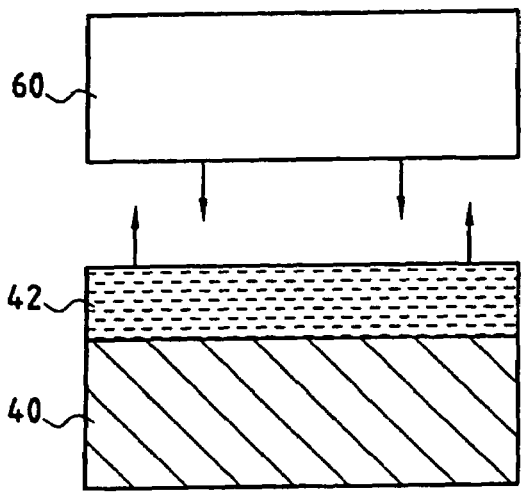

As illustrated in FIG. 7, the method generally applies to connecting a substrate 40 (or a layer) having an atypical surface to a substrate 60 (or a layer) with a chemical composition and roughness that are compatible with bonding by molecular bonding, wherein the roughness of the substrate 60 is below about 0.5 nm rms. That is, the substrate 40 is difficult to polish to or has very high roughness, and is in any case has a roughness of more than 0.5 nm rms, for example in the range of about 1 nm rms to about 100 nm rms, or has a chemical composition that is incompatible with bonding by molecular bonding. A bonding layer 42 is formed on the substrate 40, directly or with an intermediate layer as explained above. The bonding layer is silicon dioxide, for example. It is then possible to establish a bond by molecular bonding between this bonding layer and the substrate 60. The foregoing description also applies if the layer of silicon or semiconductor material is replaced by the layer or the substrate 60. In the last two cases, the material of each substrate that is difficult to polish or has roughness of more than about 0.5 nm rms or has chemical composition that is incompatible with bonding by molecular bonding, can be selected from the materials mentioned above, for example, diamond or aluminum nitride (AlN).

What is claimed is:

1. A semiconductor structure comprising:
   a substrate having a surface and being made of a material that provides atypical surface properties to the surface, with the atypical surface properties comprising at least one of a roughness of more than 0.5 nm rms, or a roughness of at least 0.4 nm rms that is difficult to polish, or a chemical composition that is incompatible with molecular bonding;
   a bonding layer located on the surface of the substrate; and
   a further layer molecularly bonded to the bonding layer;
   wherein at least one portion of a surface of the bonding layer facing the further layer is positioned at a distance of 10 nm or less from a peak of the substrate to optimize heat transfer from the further layer to the substrate.

2. The structure of claim 1 which further comprises at least one power component or radio frequency (RF) component in the further layer of semiconductor material.

3. The structure of claim 1 which further comprises at least one insulated gate bipolar transistor (IGBT) component or metal oxide on silicon field effect transistor (MOSFET) component in the further layer of semiconductor material.

4. The structure of claim 1 wherein the substrate comprises diamond or aluminum nitride material.

5. The structure of claim 1 wherein the further layer is a semiconductor material comprising at least one of silicon, germanium, gallium arsenide, silicon-germanium, a semiconductor Group III-Group V material, or a semiconductor Group II-Group VI material.

6. The structure of claim 1 wherein the bonding layer has a thickness in the range of about 5 nm to about 20 nm.

7. The structure of claim 1 wherein the bonding layer comprises at least one of silicon dioxide ($SiO_2$), silicon nitride ($Si_3N_4$), hafnium oxide, zirconium oxide, alumina, or yttrium oxide.

8. The structure of claim 1 wherein the substrate has a thermal conductivity of more than 1 W/cm/K.

9. The structure of claim 1 wherein the structure is a Semiconductor-On-Insulator (SOI) structure.

10. The structure of claim 1 wherein the substrate material comprises an intermediate layer that provides the surface having the atypical surface properties and the bonding layer that has a thermal conductivity that is higher than that of the substrate or that is between that of the bonding layer and that of the substrate.

11. The structure of claim 10 wherein the intermediate layer is silicon nitride.

12. The structure of claim 1 wherein the further layer is a second substrate of a material having atypical surface properties.

13. The structure of claim 1, wherein the bonding layer is in contact with one or more peaks of the substrate.

* * * * *